United States Patent [19]

Vazehgoo

[11] Patent Number: 4,649,297
[45] Date of Patent: Mar. 10, 1987

[54] TTL CIRCUITS GENERATING COMPLEMENTARY SIGNALS

[75] Inventor: Farhad Vazehgoo, South Portland, Me.

[73] Assignee: Fairchild Semiconductor Corporation, Cupertino, Calif.

[21] Appl. No.: 704,375

[22] Filed: Feb. 22, 1985

[51] Int. Cl.[4] .............. H03K 19/088; H03K 19/092; H03K 17/60; H03K 19/013

[52] U.S. Cl. .................................. 307/456; 307/473; 307/270; 307/300; 307/280

[58] Field of Search ............... 307/456, 473, 443, 270, 307/280, 300, 254

[56] References Cited

U.S. PATENT DOCUMENTS

| | | | |
|---|---|---|---|
| 4,287,433 | 9/1981 | Goodspeed | 307/473 |
| 4,311,927 | 1/1982 | Ferris | 307/473 |
| 4,529,896 | 7/1985 | Grandguillot et al. | 307/456 X |
| 4,584,490 | 4/1986 | West | 307/456 |

FOREIGN PATENT DOCUMENTS 0122125  7/1984  Japan ................... 307/473

*Primary Examiner*—Stanley D. Miller
*Assistant Examiner*—David R. Bertelson
*Attorney, Agent, or Firm*—Kenneth Olsen; David H. Carroll; Daniel H. Kane, Jr.

[57] ABSTRACT

TTL circuits are described for generating from an input signal complementary output signals useful in integrated circuit applications. For an enable gate, an alternate enable transistor element is coupled in emitter follower configuration in the enable gate with the base of the alternate enable transistor coupled to follow the enable gate input signal $\overline{E}$ and provide through the emitter circuit an alternate enable signal A complementary to the enable signal E. The complementary enable signals are applied in an improved TTL tristate output device with reduced output capacitance. The alternate enable signal A is coupled to the base of an active discharge transistor element at the base of the pull-down transistor of the tristate input device for actively discharging and diverting Miller feedback current caused by transitions on the common bus output when the enable signal E is at low potential and the device is in the high impedance third state. In another application an internal buffer circuit generates complementary data signals by coupling a complementary data signal transistor element in emitter follower configuration in the buffer circuit. The base of the complementary data signal transistor is coupled to follow the input data signal D and provide through the emitter circuit a complementary output data signal D in phase with the input data signal D and complementary to the output data signal $\overline{D}$ at the output of the buffer circuit.

21 Claims, 9 Drawing Figures

TTL CIRCUITS GENERATING COMPLEMENTARY SIGNALS

TECHNICAL FIELD

This invention relates to new and improved TTL circuits for generating from an input signal complementary output signals useful in integrated circuit applications. The invention provides new internal buffer circuits for generating complementary data signals while resolving the problem of current hogging. The invention also provides new enable circuits which generate complementary enable control signals for TTL output devices. In the latter application the invention provides an improved TTL tristate output device with reduced output capacitance.

BACKGROUND ART

A prior art TTL tristate output device with reduced output capacitance is described in the Ferris U.S. Pat. No. 4,311,927 issued Jan. 19, 1982, entitled "Transistor Logic Tristate Device with Reduced Output Capacitance" with a related improvement described in the Ferris, et al. U.S. patent application Ser. No. 586,671 filed Mar. 6, 1984. The latter tristate output device 10, illustrated in FIG. 1, is provided with an input 12 for receiving binary data signals Vi of high and low potential and for transmitting output signals Vo to a common bus, not shown, coupled at the tristate device output 14. For operation in the bistate mode, the tristate device includes a pull-up transistor element comprising Darlington transistor pair Q2 and Q3 for sourcing current to the output 14 from high potential source Vcc and a pull-down transistor element Q4 for sinking current from the output 14 to low potential or ground. Phase splitter transistor element Q1 with collector resistor R1 is coupled at the input 12 to control the states of the pull-up and pull-down transistor elements in response to data signals Vi at the input. The pull-down transistor element Q4 includes a conventional squaring network at its base comprised of transistor Q5 with base and collector resistors R3 and R4.

For the tristate mode of operation, a prior art enable gate 20 illustrated in FIG. 2, is operatively coupled at the enable input 15 of tristate device 10. The high impedance third state is established at the output 14 of the tristate device when the enable gate output signal E is at low potential and the pull-up and phase splitter transistor elements are deprived of base drive current through diodes D1 and D2. For reducing the effective output capacitance during the high impedance third state, an active discharge sequence consisting of transistors Q7 and Q6 and diode cluster D3, D4, and D5 is operatively coupled between the base of pull-down transistor element Q4 and the enable input 15. The active discharge sequence affords a low impedance route to ground from the base of the pull-down element through transistor Q7 when the enable gate maintains a low potential enable signal E at enable input 15 and the tristate device is in the high impedance third state. As a result, low to high potential transitions on a common bus coupled at the tristate output 14 will not incidentally drive the pull-down transistor element Q4 to conduction. Any capacitive Miller feedback current through the collector to base capacitance of transistor Q4 is rapidly diverted and discharged to ground through active discharge transistor element Q7. During the bistate mode of operation when the enable signal E is at high potential, the active discharge sequence blocks current flow from high potential to the pull-down transistor element Q4.

The active discharge sequence as described in U.S. Pat. No. 4,311,927 comprises a sequence of three active element transistors in a double inversion series coupling between the enable gate and the base of the pull-down transistor. As a result of the double inversion, the collector potential of the active discharge transistor coupled at the base of the pull-down transistor element follows in phase the high or low potential of the enable signal E, discharging the base of the pull-down transistor when the enable signal E is at low potential and the tristate device 10 is in the high impedance third state. In the circuit of FIG. 1, one of the transistors in the active discharge sequence next to the enable input 15 is replaced with the passive diode cluster D3, D4, D5, coupled in a delta configuration and power supply resistors R5, R6, R7 coupled in a Y network. The passive diode cluster is operatively arranged for delivering base drive current to the base of the second transistor Q6 thereby depriving the active discharge transistor Q7 of base drive current when the enable signal E at the enable input 15 is at high potential for operation of the tristate device in the bistate mode. The passive diode cluster also operatively diverts base drive current away from the base of the second transistor Q6 when the enable signal E is at low potential so that active discharge transistor Q7 actively conducts away from the base of the pull-down transistor Q4 for operation of the device with reduced output capacitance during the high impedance third state.

In either case there is double inversion. The collector potential of transistor Q6 follows out of phase with the enable signal potential E, and the collector potential of active discharge transistor Q7 follows in phase requiring two inversions of the enable signal E. The silicon area taken up by the active discharge sequence in either of the prior art tristate devices with low output capacitance is relatively large and this large area is multiplied when many tristate devices are tied to a common bus. Furthermore, either tristate device consumes power during bistate operation of the output device.

The prior art enable gate 20 shown in FIG. 2 is a bistate device with generates the enable signal E at enable gate output 16 from an enable gate input signal E at the enable gate input 18. The enable gate includes the enable pull-up Darlington transistor element Q22 and Q23, enable pull-down transistor element Q24, enable phase splitter transistor element 21 and collector resistor R21 operatively coupled to control the states of the enable pull-up and pull-down transistor elements, and a first enable input transistor element Q28 with collector resistor R28 and input diodes D21 and D22 operatively coupled for following and applying the enable gate signal input $\overline{E}$ to the base of the enable phase splitter transistor element 21. Because the collector potential of the active discharge transistor Q7 must follow in phase the enable gate output signal E with intermediate elements to block current flow from high potential during bistate operation, the double inversion sequence is required in the tristate device 10.

A prior art TTL internal buffer circuit for generating complementary data signals such as true and false data signals D and $\overline{D}$ from an input data signal D is illustrated in FIG. 3. The internal buffer circuit 30 is a bistate device with pull-up Darlington transistor element Q32 and Q33, pull-down transistor element Q34 and dual phase splitters Q31 and Q31a for controlling the state of the pull-up and pull-down transistor elements to provide high and low level output data signals $\overline{D}$ at the buffer output 36 in response to input data signals D at the buffer input 38. Input transistor element Q38 with collector resistor R38 and input diodes D31 and D32 are operatively coupled to apply an input data signal D to the bases of the dual phase splitter transistors Q31 and Q31a. Dual phase splitter transistor Q31a is added to generate the complementary data signal and the collector potential of Q31a is tapped to provide the complementary input signal $\overline{D}$ to complementary buffer 40, a similar bistate buffer device which inverts the complementary input $\overline{D}$ to the complementary output data signal D. The collector potential of dual phase splitter Q31a may be used to provide the input to multiple complementary buffers such as buffer 40 although only one is shown by way of example in FIG. 3.

A schematic block diagram of this conventional buffer circuit for generating true and false data signals is illustrated in FIG. 4. The TTL bistate buffer 30 is inherently inverting at the output 36. The dual phase splitter Q31a is also inherently inverting at its collector 31a which is tapped to provide the complementary inputs $\overline{D}$ to one or more complementary buffers 40 which also inherently invert the complementary inputs at outputs 46 to provide the complementary output signals D. The complementary buffers 30 and 40 therefore provide the complementary true and false signals $\overline{D}$ and D from the single input signal D. A disadvantage of this arrangement using dual phase splitters however, is the problem of current hogging. The current mirror configuration of the dual phase splitters requires that the emitter currents equalize and a greater collector to emitter current in one phase splitter results in "hogging" of the base drive leaving insufficient current in the other, for example to drive multiple complementary buffers.

OBJECTS OF THE INVENTION

It is therefore an object of the present invention to provide new TTL circuits for generating from a single input signal complementary output signals for a variety of applications. For example, one object of the invention is to provide new enable gates for generating complementary enable control signals for application in TTL tristate output devices with reduced output capacitance, and another to provide new internal logic buffers for generating complementary true and false data signals.

Another object of the invention is to provide enable gates and improved TTL tristate output devices with reduced output capacitance having faster operation, reduced integrated circuit fabrication area, and reduced power consumption. The invention also provides internal IC buffer circuits which generate complementary data signals without the disadvantage of "current hogging" experienced in conventional dual phase splitter buffer circuits.

A further object of the invention is to provide a variety of TTL circuits for generating from a single input signal complementary output signals over complementary signal current paths of substantially equal impedance and equal potential drops for integrated circuit applications.

DISCLOSURE OF THE INVENTION

In order to accomplish these results the present invention provides an improved enable gate for generating complementary enable signals E and A from an enable gate input signal $\overline{E}$. The enable gate includes the conventional pull-up and pull-down transistor elements operatively coupled to provide high and low level signals E at the enable gate output, phase splitter transistor element operatively coupled to control the states of the pull-up and pull-down transistor elements, and a first input transistor element for applying the enable gate input signal $\overline{E}$ to the base of the phase splitter. In the improved enable gate, according to the invention, an alternate enable transistor element is coupled in emitter follower configuration in the enable gate with the base of the alternate enable transistor coupled to follow the enable gate input signal $\overline{E}$ and provide through the emitter circuit of the alternate enable transistor element an alternate enable signal A in phase with the enable gate input signal $\overline{E}$ and complementary to the enable signal E at the output of the enable gate.

In the preferred embodiment the alternate enable transistor element comprises a second input transistor coupled in emitter follower configuration with the base of the second input transistor element tied to the base of the first input transistor element. Thus, the bases of the first and second input transistors are coupled to follow the enable input signal $\overline{E}$. The alternate enable signal A may be used as hereafter described in the control of multiple output gates increasing the current drawn through the alternate enable signal path. It is therefore preferable to tie the base of the emitter follower to the first input transistor so that the emitter follower cannot be turned off as readily by the voltage drop across D23 which increases exponentially with current. However, the base of the emitter follower may also be tied to other stages of the enable gate such as the base of the phase splitter transistor element or the base of the pull-down transistor element.

A voltage level shifting component is coupled in the emitter circuit of the alternate enable transistor element in the improved enable gate so that the impedance of the current path of enable signal E through the enable gate and the impedance of the current path of the alternate enable signal A through the alternate enable transistor element emitter circuit are substantially equal. The voltage level shifting component in the emitter circuit of the alternate enable transistor element may comprise, for example at least one diode.

The invention also provides an improved TTL tristate output device with reduced output capacitance incorporating the new enable gate. The tristate output device includes the conventional features of an output, a bistate mode of operation, a pull-down transistor element for sinking current from the output to low potential, an enable input for establishing a high impedance third state at the output of the tristate device, and an active discharge transistor element coupled to the base of the pull-down transistor for providing a route to ground when the active discharge transistor element is conducting. According to the invention the enable signal E at the improved enable gate output is coupled to the enable input of the tristate device and the alternate enable signal A from the emitter circuit of the alternate enable transistor element of the improved enable gate is coupled to the base of the active discharge transistor element in the tristate device through a limiting resistor. Miller feedback current through the collector to base capacitance of the pull-down transistor element caused by low to high potential transitions on the common bus is rapidly diverted and discharged to ground through the conducting active discharge transistor element.

A feature and advantage of the TTL tristate output device with reduced output capacitance, according to the invention, is that the double inversion active discharge sequence is replaced by a single active discharge transistor thereby increasing the speed of operation of the device, greatly reducing the required silicon fabrication area for reducing the output capacitance for IC tristate devices, and eliminating power consumption by active discharge elements during the bistate mode of operation.

According to another embodiment, the invention provides new and improved TTL buffer circuits for generating complementary data signals. Such internal buffer circuits include the conventional features of an input and an output, pull-up and pull-down transistor elements operatively coupled to provide high and low level voltage output data signals $\overline{D}$ at the output, phase splitter transistor element operatively coupled to control the states of the pull-up and and pull-down transistor elements, and an input transistor element operatively coupled for applying an input data signal D to the base of the phase splitter transistor element. According to the invention, a complementary data signal transistor element is operatively coupled in emitter follower configuration in the buffer circuit with the base of the complementary data signal transistor element coupled to follow the input data signal D and provide through the emitter circuit of the complementary data signal transistor element a complementary output data signal D in phase with the input signal D and complementary to the output data signal $\overline{D}$ at the output of the buffer circuit.

In the preferred embodiment the base of the complementary data signal transistor element is tied to the base of the phase splitter transistor element and a voltage level shifting component is coupled in the emitter circuit of the complementary data signal transistor to equalize substantially the impedance of the current paths of the output data signals $\overline{D}$ and the complementary output data signals D. A feature and advantage of the new buffer circuit is that one of the current mirror configuration dual phase splitters of conventional complementary data signal buffer circuits is eliminated or rather displaced and instead is coupled to the emitter circuit of the complementary data signal emitter follower transistor element to provide a complementary output transistor. Alternately, this complementary output transistor may be viewed as an inverting input to a complementary output buffer for delivering the complementary output data signal D in phase with the input signal D and complementary to the output data signal $\overline{D}$ of the original internal buffer circuit.

Thus, the invention contemplates providing a complementary data signal transistor element operatively coupled in emitter follower configuration in a conventional inverting TTL buffer circuit for following the input data signals D. The emitter circuit of the complementary data signal transistor element is then appropriately coupled to a double inverting complementary buffer circuit for providing the complementary output data signals D in phase with the input data signals D but complementary to the single inverted output data signals $\overline{D}$. A feature and advantage of this arrangement is that the use of current mirror configuration dual phase splitters in the original internal buffer circuit is eliminated thereby also eliminating the problem of "current hogging" between the dual phase splitter experienced with conventional complementary data signal buffer circuits.

Other objects, features, and advantages of the invention are apparent in the following specification and accompanying drawings.

DESCRIPTION OF PREFERRED EXAMPLE EMBODIMENTS AND BEST MODE OF THE INVENTION

Figure 1:
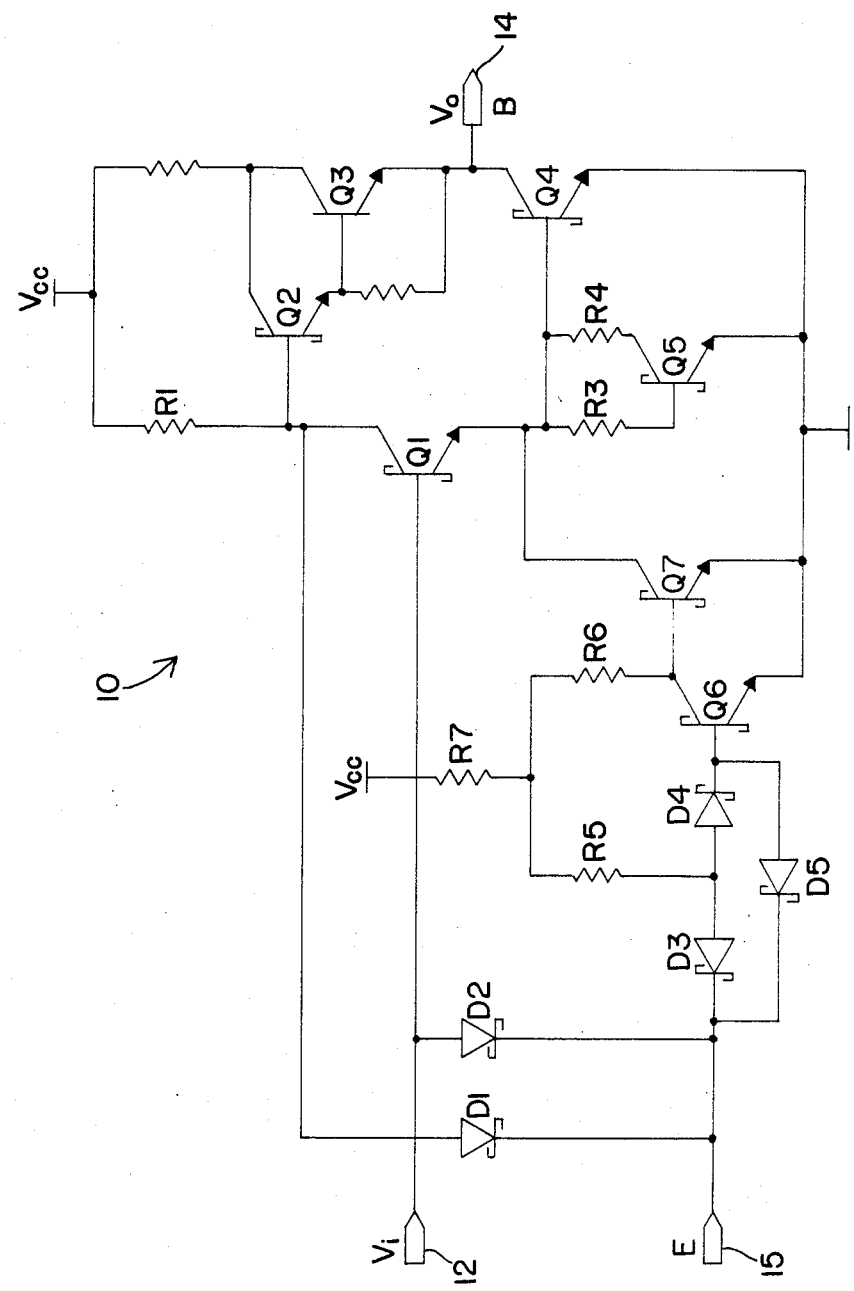
FIG. 1 is a schematic diagram of a prior art TTL tristate output device with reduced output capacitance.
Figure 5:
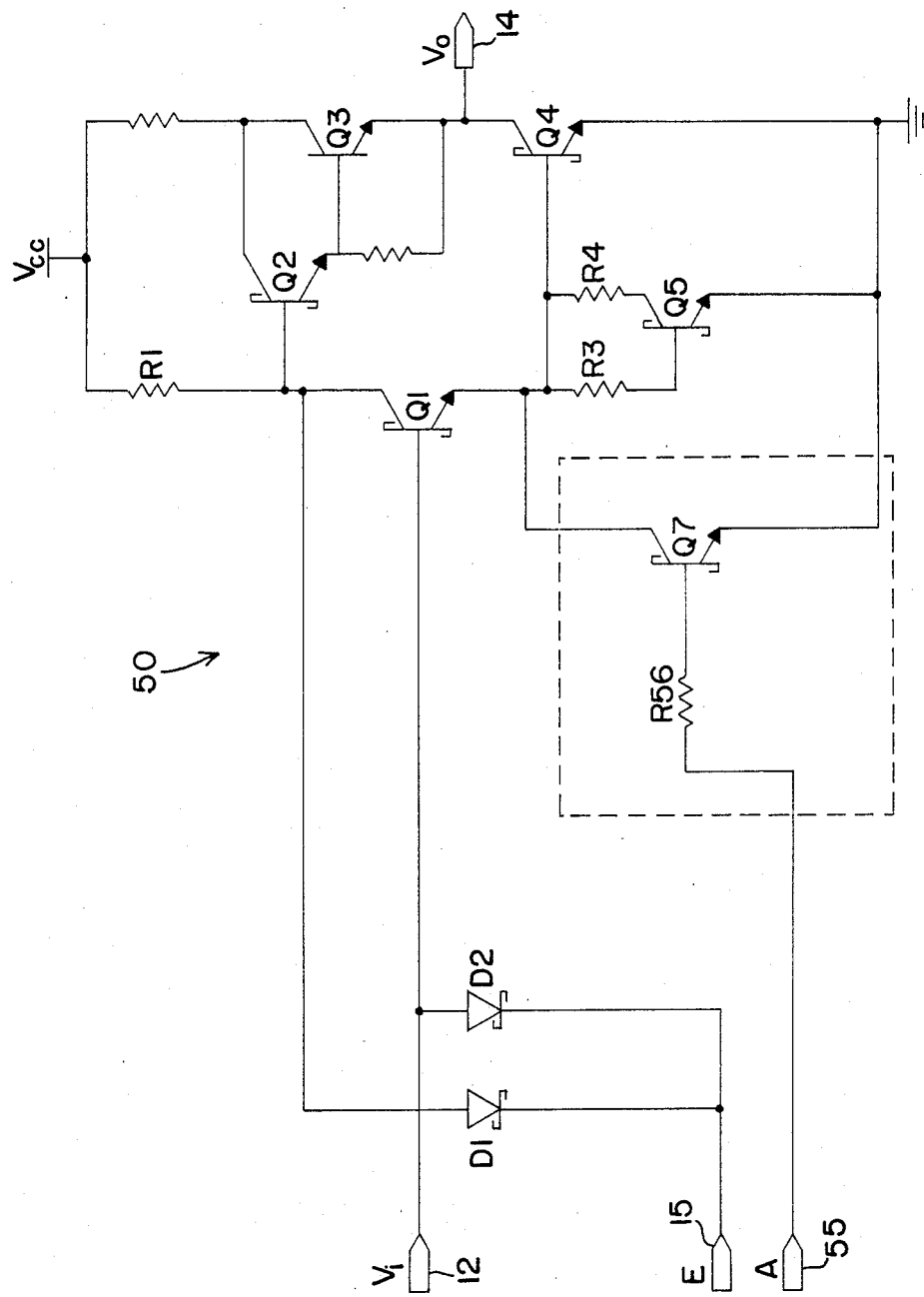
FIG. 5 is a schematic diagram of a TTL tristate output device with reduced output capacitance according to the present invention.

An improved TTL tristate output device 50 with reduced output capacitance according to the present invention is illustrated in FIG. 5. The new tristate device 50 of FIG. 5 incorporates the primary operational elements and features heretofore described with reference to the prior art tristate device 10 of FIG. 1 and the same operating components are designated by the same reference numerals and letter designations. However, a feature and advantage of the present invention is that the double inversion active discharge sequence has been eliminated. In its place the present invention provides the single active discharge transistor element Q7 at the base of pull-down transistor Q4. Active discharge transistor Q7 provides a low impedance path to ground from the base of pull-down transistor Q4 for reducing the effective output capacitance when the enable signal E is at low potential and the tristate device 50 is in the high impedance third state.

Figure 2:
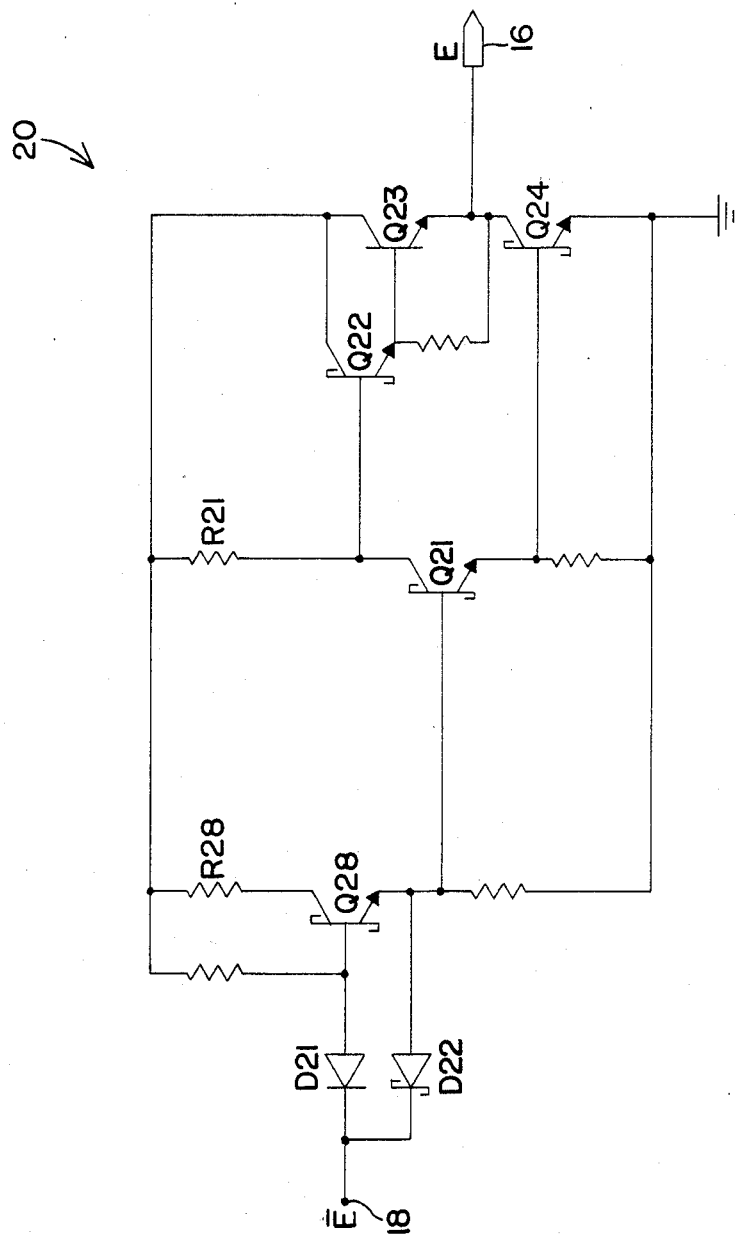
FIG. 2 is a schematic diagram of a prior art enable gate for generating enable signals E for the enable input of a tristate output device.
Figure 6:
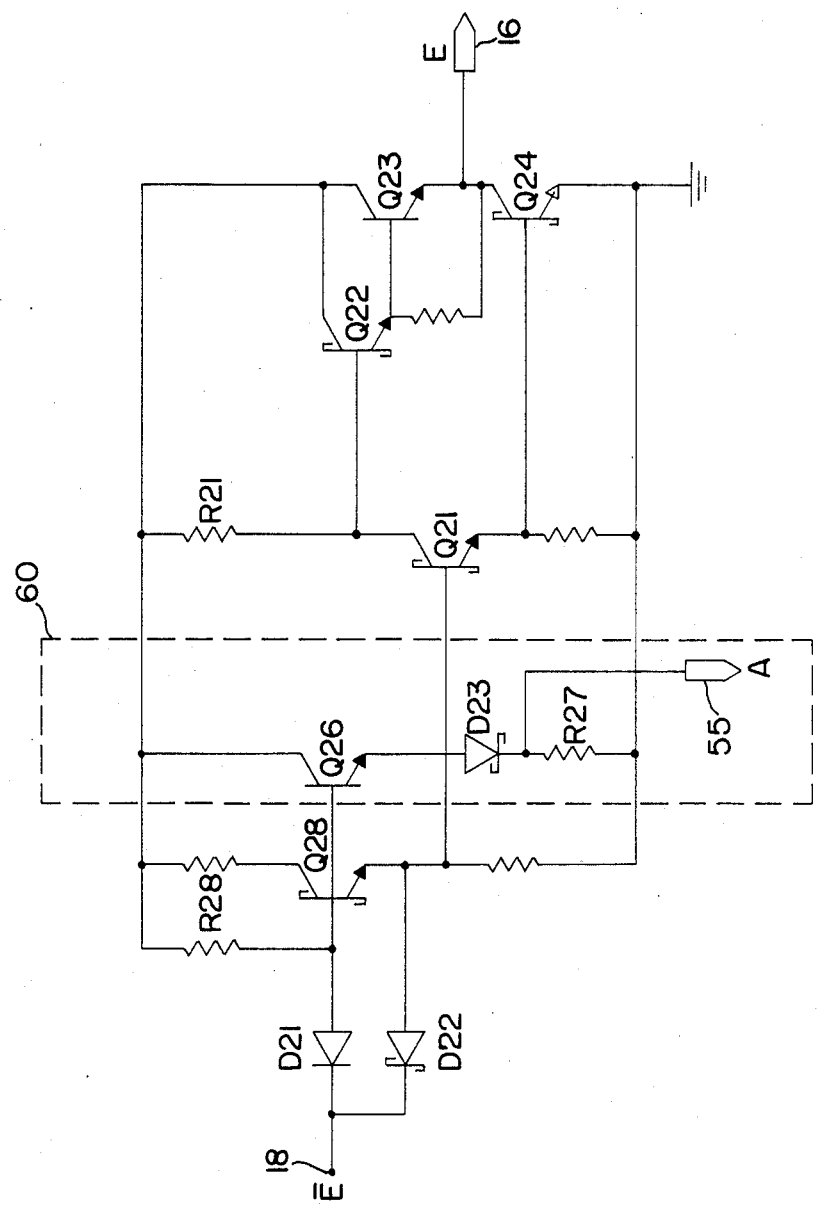
FIG. 6 is a block diagram of an enable gate according to the present invention for generating complementary enable signals for the TTL tristate output device of FIG. 5.

This is accomplished by applying an alternate enable control signal A complementary to the enable signal E to the base of active discharge transistor Q7 at alternate enable input 55 through limiting resistor R56. According to the invention the alternate enable signal A is derived from an improved enable gate illustrated in FIG. 6. The enable gate of FIG. 6 incorporates the primary operational elements and features described with reference to the prior art enable gate 20 of FIG. 2 and the same operating components are designated by the same reference numerals and letter designations. In the improved enable gate of FIG. 6, however, an alternate enable circuit portion 60 is incorporated in the enable gate including an alternate enable transistor element 26 coupled in emitter follower configuration with the base of alternate enable transistor Q26 coupled to follow in phase with the enable gate input signal $\overline{E}$. A voltage level shifting component, diode D23 is included in the emitter circuit of the emitter follower Q26 leading to the alternate enable terminal 55 to equalize substantially the voltage drops and therefore the impedance through the current paths of enable signal E and alternate enable signal A. The voltage drop through the enable signal current path shown in FIG. 6 equals $$V_{be}Q28 + V_{be}Q21 + V_{be}Q24$$

while the potential drop through the signal path of the alternate enable signal A shown in FIGS. 6 and 5 equals $$V_{be}Q26 + V_{sd}D23 + V_{be}Q7$$

neglecting the resistance of limiting resistor R56. The intrinsic voltage drop $V_{be}$ of typical IC transistor devices is in the order of 0.8 volts while the intrinsic voltage drop $V_{sd}$ of a typical Schottky diode device D23 is in the order of 0.6 volts. As a result, inclusion of diode D23 in the emitter circuit of emitter follower Q26 substantially equalizes the impedance of the two signal paths.

In the preferred embodiment the alternate enable transistor element Q26 forms a second input transistor but coupled in emitter follower configuration with the base tied to the base of the first input transistor Q28. The bases of both transistors therefore follow in phase the enable input signal $\overline{E}$. The alternate enable signal A from the emitter of alternate enable transistor Q26 may be used in the control of multiple output gates 50 of the type illustrated in FIG. 5. Control of multiple output gates increases the current drawn through the alternate enable signal path increasing the voltage drop across voltage level shifting diode D23 according to the diode law. Because of the emitter follower configuration of the alternate enable transistor, a sufficient voltage drop across diode D3 may turn off transistor Q26. Tying the base of emitter follower transistor Q26 to the base of the input transistor Q28 maximizes the current which may be drawn through node or terminal 55 and therefore the number of tristate output devices 50 which may be controlled by the alternate enable signal A without effecting the operation of the emitter follower Q26.

Figure 6A:
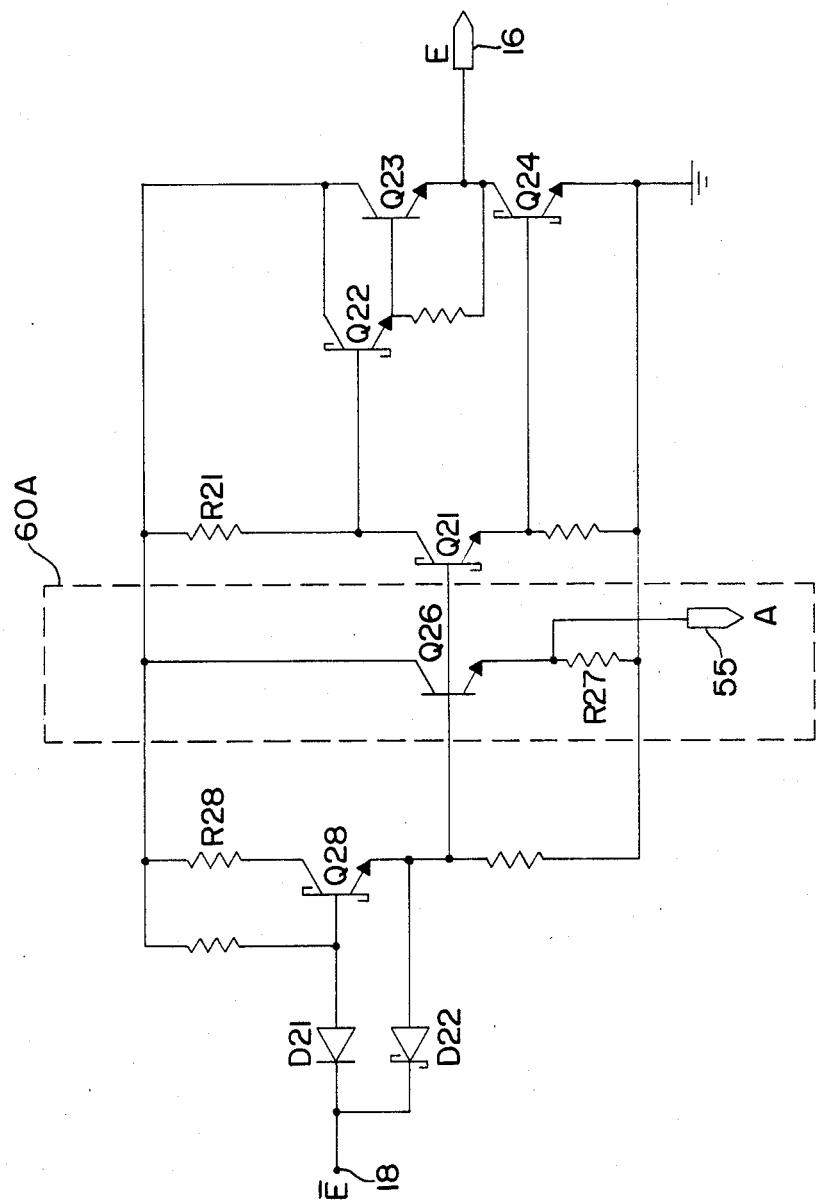
FIG. 6A is a schematic diagram of an alternative embodiment of the new enable gate for generating complementary enable control signals.

However, for smaller current applications where fewer output devices are controlled by the alternate enable signal A, the alternate enable circuit portion 60 may be coupled in emitter follower configuration at any of the stages of the enable gate, for example, as shown in FIG. 6A. In FIG. 6A is illustrated an enable gate of the type shown in FIG. 6, however the alternate enable circuit portion 60A is tied to the second stage of phase splitter transistor Q21 of the enable gate. Thus, alternate enable transistor element Q26 is coupled in emitter follower configuration to follow in phase the enable gate input signal $\overline{E}$ with the base of emitter follower Q26 tied to the base of phase splitter transistor element Q21. Voltage level shifting diode D23 is no longer required. Emitter follower Q26 is coupled to the alternate enable terminal or node 55 and is separated from ground by leakage resistor R27 as heretofore described.

A feature and advantage of the emitter follower configurations 60 and 60A according to the present invention is that the emitter circuit and signal path of the alternate enable signal A follows in phase with the enable gate input signal $\overline{E}$ and is out of phase and complementary to the enable gate output signal or enable signal E. Furthermore, the enable signal E and alternate enable signal A follows signal paths of substantially similar impedance. Another feature and advantage of the improved enable gate of FIGS. 6 and 6A is that the complementary enable control signals E and A may be applied directly in an improved TTL tristate output device 50 for reduced output capacitance without requiring the double inversion active discharge sequence of the prior art.

Thus, as shown in FIG. 5 an alternate enable signal A of high potential may be applied directly to drive the base of active discharge transistor Q7 when the enable signal E at enable input 15 is at low potential and the tristate output device is in the high impedance third state. In this condition active discharge transistor Q7 is conducting providing a low impedance path to ground for diverting and dissipating Miller feedback current at the pull-down transistor element Q24 caused by potential transitions on the common bus. This is accomplished according to the present invention by "reaching back" into a preferred stage of the enable gate with an emitter follower alternate enable transistor element and emitter circuit which follows in phase the enable gate input signal $\overline{E}$.

The limiting resistor or stabilizing resistor R56 at the base of active discharge transistor Q7 is required for stabilizing operation of the emitter follower alternate enable circuit of the present invention. Limiting resistor R56 moderates the potential at the alternate enable signal node or terminal 55, limits current to the base of active discharge transistor Q7, and prevents damage to the transistor which may otherwise occur by use of the emitter follower configuration. Stabilizing resistor R56 may be selected typically in the order of 200 ohms.

Figure 3:
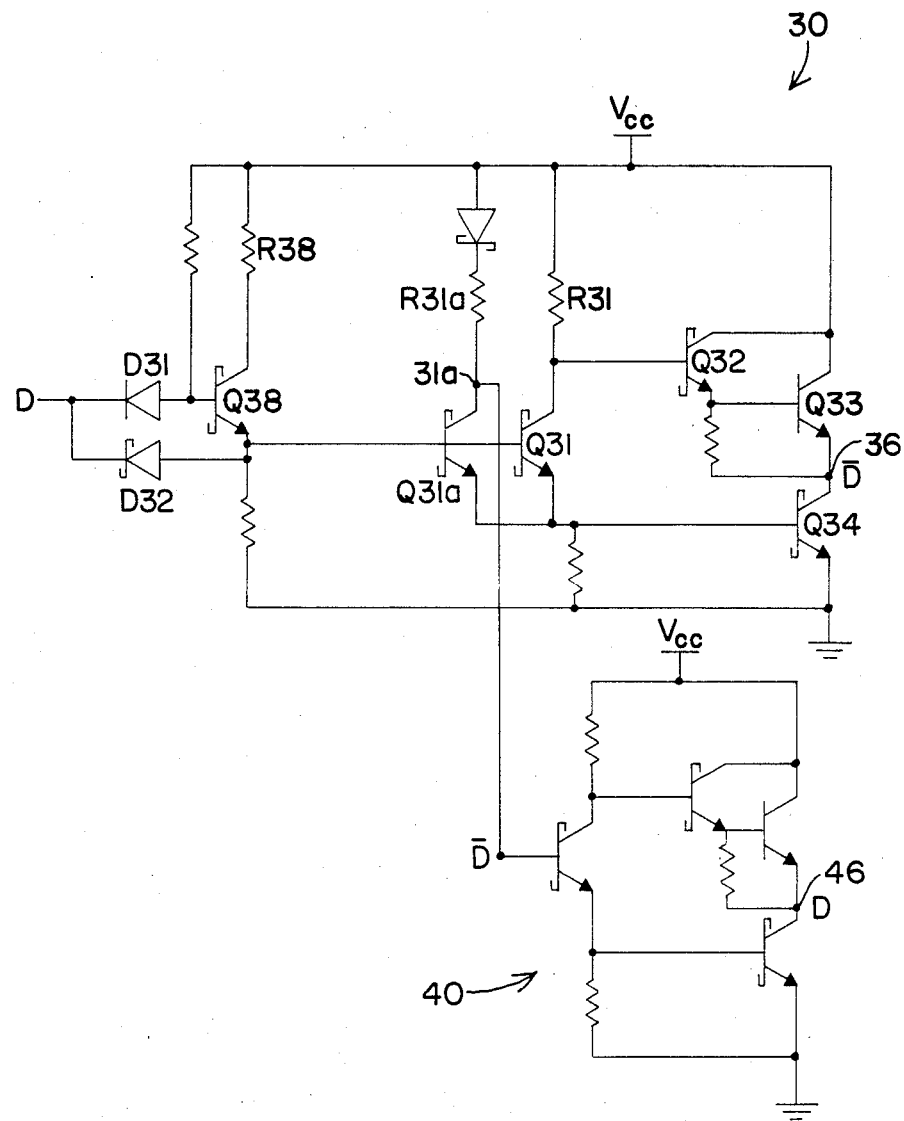
FIG. 3 is a schematic diagram of a prior art TTL buffer circuit for generating from an input data signal complementary output data signals.
Figure 4:
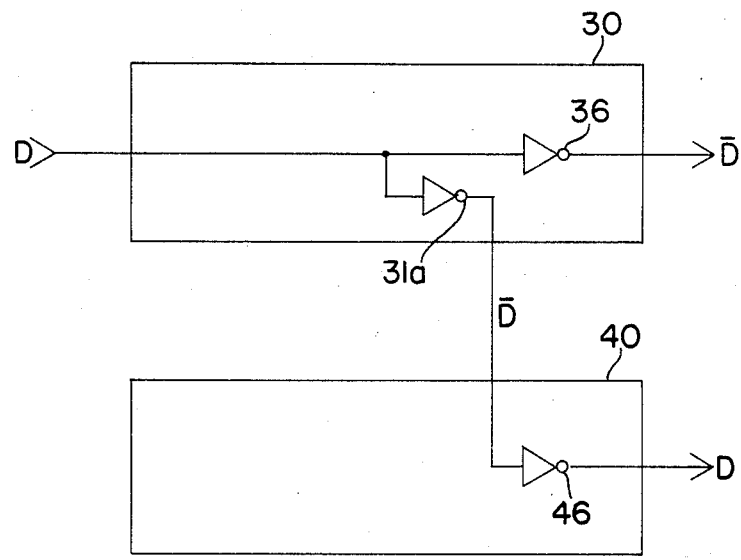
FIG. 4 is a simplified block diagram of the prior art TTL buffer circuit of FIG. 3 for generating complementary data signals.
Figure 7:
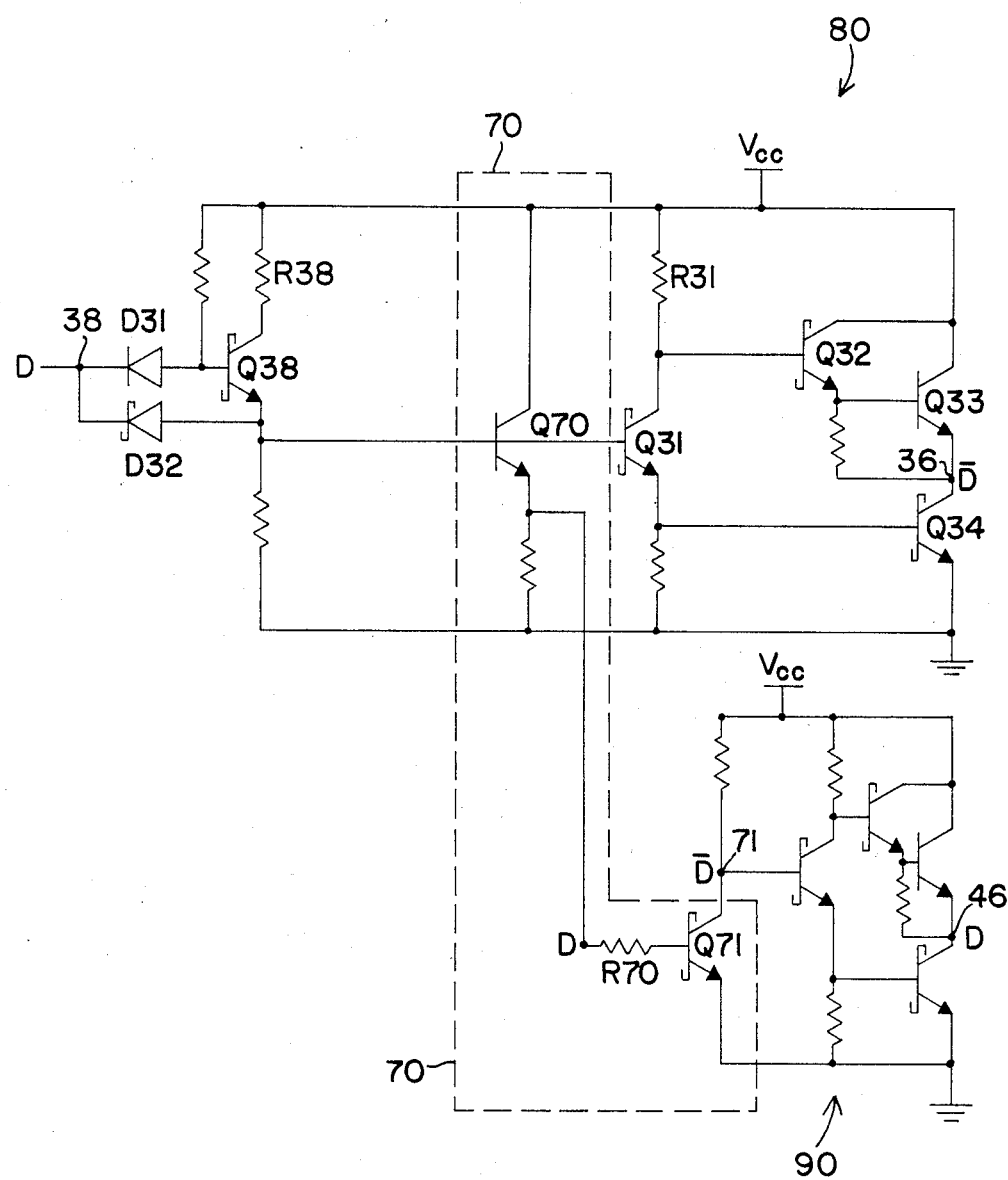
FIG. 7 is a schematic diagram of a TTL internal buffer circuit for generating from an input data signal D complementary output data signals D and $\overline{D}$ according to the present invention.

An internal TTL buffer circuit 80 for generating complementary data signals according to the present invention is illustrated in FIG. 7. The internal TTL buffer 80 incorporates the major operational components of the prior art TTL buffer circuit 30 illustrated in FIG. 3 and similar components are designated by the same reference numerals and letter designations. The circuit for generating complementary data signals shown in FIG. 7 also includes a complementary buffer 90 which incorporates the major operational components of the complementary buffer circuit 40 illustrated in FIG. 3.

The coupling circuitry between the internal TTL buffer circuit 80 and complementary buffer 90 indicated in dashed outline designated by the reference numeral 70, however, provides substantial improvement over the prior art. Rather than coupling the input of the complementary buffer to the collector of a dual phase splitter transistor Q31a as shown in the prior art circuit of FIG. 3, the present invention incorporates a complementary data signal transistor element Q70 into the TTL buffer circuit 80 in emitter follower configuration. The base of the complementary data signal transistor Q70 is coupled to follow the input data signal D at the input 38 of buffer circuit and provide through the emitter circuit of transistor element Q70 a complementary output data signal D in phase with the input data signal D and complementary to the output data signal $\overline{D}$ at the output of buffer circuit 80. The prior art coupling of the buffer circuit 40 to the collector of a clamped dual phase splitter transistor Q31a inverts the input data signal D and provides the inverted data signal $\overline{D}$ at the input of the complementary buffer 40. However, the dual phase splitters Q31 and Q31a of the prior art buffer circuit 30 are subject to the disadvantage of "current hogging". The base and emitter terminals of dual phase splitter transistors Q31 and Q31a are tied together in parallel so that a greater collector to emitter current through one of the dual phase splitters will dispropor- tionately draw and "hog" the base drive current. This may particularly arise when the dual phase splitter of the internal buffer circuit 30 drives a plurality of com- plementary buffers 40.

This problem is eliminated according to the present invention by coupling the complementary buffer 90 to the internal buffer circuit 80 through an emitter fol- lower complementary data signal transistor element Q70 as heretofore described with reference to FIG. 7. The base of complementary data signal transistor Q70 is tied to the base of the buffer circuit phase splitter tran- sistor element Q31. However, because of the emitter follower coupling, the emitter circuit of transistor Q70 provides a complementary data signal D in phase with the input data signal D at the input 38 of buffer circuit 80. The input to complementary buffer 90 is therefore a complementary data signal D which must be doubly inverted. In order to provide a double inverting com- plementary buffer 90 according to the invention, a tran- sistor stage Q71 is added which may be viewed as a complementary output transistor of the emitter circuit 70 of complementary data signal transistor element Q70 or as an input transistor or input stage of complemen- tary buffer 90. The input to the base of the phase splitter of complementary buffer 90 is therefore coupled to the collector terminal or node 71 of input stage transistor element Q71 to provide a first inversion while a second inversion is provided at the output node 46 of the com- plementary buffer.

Figure 8:
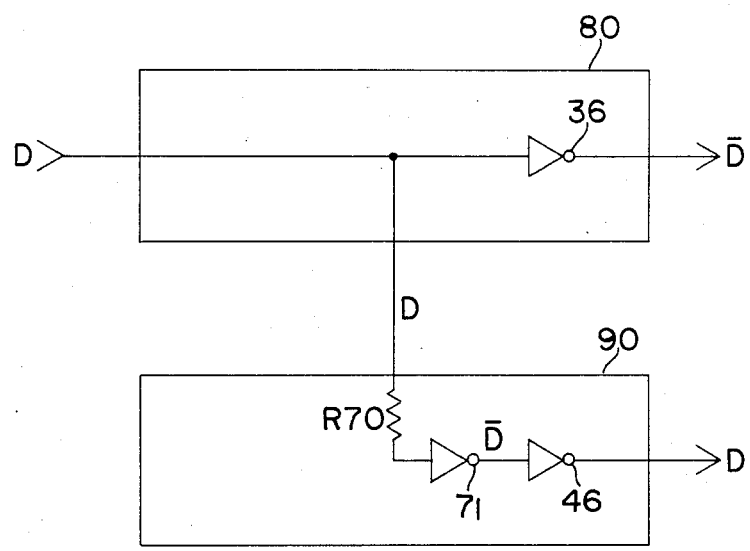
FIG. 8 is a simplified block diagram of the internal buffer circuit for generating complementary data signals shown in FIG. 7.

A block diagram summarizing the improved buffer circuit for generating complementary data signals is illustrated in FIG. 8 showing the internal buffer circuit 80 which delivers an output data signal $\overline{D}$ from input data signal D with a single inversion and the comple- mentary buffer circuit 90 which delivers a complemen- tary data signal D in phase with the input data signal D through a double inversion. The limiting or stabilizing resistor R70 stabilizes operation of the emitter follower transistor Q70 by moderating the potential at the input to the complementary buffer and by limiting current to the base of complementary buffer input transistor Q71.

Thus, according to the present invention, the dual phase splitter transistor Q31a of the prior art buffer circuit 30 is eliminated in favor of a complementary data signal emitter follower Q70. Furthermore, the inversion afforded by coupling the complementary buffer to the collector of the dual phase splitter transis- tor is displaced by using the collector terminal or node 71 of a new complementary buffer input transistor Q71 so that the complementary buffer 90 according to the present invention is doubly inverting. The emitter fol- lower coupling of complementary data signal transistor element Q70 eliminates the problem of 'current hog- ging' of the prior art dual phase splitters. Furthermore, approximately the same impedance is maintained along the signal path of the output data signal $\overline{D}$ through Q38, Q31, and Q34 and the signal path of the complementary data signal D through Q38, Q70, and Q71.

While the invention has been described with refer- ence to particular example embodiments, it is intended to cover all variations and equivalents within the scope of the following claims.

I claim:

1. An improved enable gate for generating comple- mentary enable signals E and A from an enable gate input signal $\overline{E}$, said enable gate having pull-up and pull- down transistor elements operatively coupled to pro- vide high and low level enable signals E at the enable gate output, phase splitter transistor element opera- tively coupled to control the states of the pull-up and pull-down transistor elements, and a first input transis- tor element for applying the enable gate input signal $\overline{E}$ to the base of the phase splitter, the improvement com- prising:

an alternate enable transistor element coupled in emitter follower configuration in the enable gate with the base of the alternate enable transistor cou- pled to follow the enable gate input signal $\overline{E}$ and provide through the emitter circuit of the alternate enable transistor element an alternate enable signal A in phase with the enable gate input signal $\overline{E}$ and complementary to the enable signal E at the output of the enable gate.

2. The enable gate of claim 1 wherein the alternate enable transistor element comprises a second input tran- sistor element coupled in emitter follower configuration with the base of the second input transistor element tied to the base of the first input transistor element, said first and second input transistor element bases in turn cou- pled to follow the enable gate input signal $\overline{E}$.

3. The enable gate of claim 2 wherein the enable gate defines an enable signal path to the enable gate output for the enable signal E and wherein the alternate enable transistor element defines an alternate enable signal path for the alternate enable signal A, and further comprising voltage level shifting means coupled in the emitter cir- cuit of the alternate enable transistor element so that the impedance through the enable signal path and the impe- dance through the alternate enable signal path are sub- stantially equal.

4. The enable gate of claim 1 wherein the alternate enable transistor element is coupled in emitter follower configuration with the base of the alternate enable tran- sistor element tied to the base of the phase splitter tran- sistor element, said alternate enable transistor element and phase splitter transistor element bases being opera- tively coupled to follow in phase with the enable gate input signal E.

5. The enable gate of claim 3 wherein the voltage level shifting means coupled in the emitter circuit of the alternate enable transistor element comprises at least one diode.

6. The enable gate of claim 1 further comprising a TTL tristate output device with reduced output capaci- tance having an output, a bistate mode of operation, a pull-down transistor for sinking current from the output to low potential, an enable input for establishing a high impedance third state at the output of the tristate output device and an active discharge transistor element cou- pled to the base of the pull-down transistor for provid- ing a route to ground when the active discharge transis- tor element is conducting, and wherein the enable signal E at the enable gate output is coupled to the enable input of the tristate output device and wherein the alter- nate enable signal A from the emitter circuit of the alternate enable transistor element of the enable gate is coupled to the base of the active discharge transistor element in the tristate output device thereby diverting capacitive Miller feedback current from the base of the pull-down transistor when the TTL output device is in the high impedance third state.

7. The enable gate of claim 6 wherein a voltage level shifting diode is coupled in the emitter circuit of the alternate enable transistor element so that the impedance of the current path for the alternate enable signal defined by the alternate enable transistor element, voltage level shifting diode and active discharge transistor element is substantially the same as the impedance of the current path for the enable signal at the enable gate output defined by the first input transistor element, phase splitter transistor element and pull-down transistor element of the enable gate.

8. The enable gate of claim 6 further comprising voltage level shifting means coupled in the emitter circuit of the alternate enable transistor element, said voltage shifting element substantially equalizing the impedance of the respective current paths of the enable signal E and alternate enable signal A.

9. The enable gate of claim 7 wherein the alternate enable transistor element comprises a second input transistor element coupled in emitter follower configuration with the base of the second input transistor element tied to the base of the first input transistor element, said first and second input transistor element bases in turn coupled to follow the enable gate input signal $\overline{E}$.

10. An improved TTL tristate output device with reduced output capacitance, said TTL tristate output device having an output, a bistate mode of operation, pull-down transistor element for sinking current from the output to low potential, enable input for establishing a high impedance third state at the output of the device when an enable signal E is applied to the enable input, and an active discharge transistor element (Q7) coupled to the base of the pull-down transistor element for providing a route to ground and diverting capacitive feedback Miller current when the active discharge transistor element is conducting, and further comprising an enable gate constructed and arranged for generating the enable signal E at the enable gate output from an enable gate input signal e,ovs/E/ , said enable gate having enable pull-up and enable pull-down transistor elements coupled to the enable gate output, enable phase splitter transistor element operatively coupled to control the states of the enable pull-up and enable pull-down transistor elements, and a first enable input transistor element operatively coupled for following and applying the enable gate input signal $\overline{E}$ to the base of the enable phase splitter transistor element, the improvement comprising:

an alternate enable transistor element operatively coupled in emitter follower configuration in the enable gate with the base of the alternate enable transistor element coupled to follow the input gate enable signal $\overline{E}$ and provide through the emitter circuit of the alternate enable transistor element an alternate enable signal A in phase with the enable gate input signal $\overline{E}$ and complementary to the enable signal E at the output of the enable gate, said enable gate output being coupled to apply the enable signal E at the enable input of the tristate output device, said emitter circuit of the alternate enable transistor element being coupled to apply the alternate enable signal A to the base of the active discharge transistor element of the tristate output device thereby providing a route to ground and diverting capacitive feedback Miller current from the pull-down transistor element when the tristate output device is in the high impedance third state.

11. The tristate output device of claim 10 further comprising voltage level shifting means coupled in the emitter circuit of the alternate enable transistor element, said voltage level shifting means substantially equalizing the impedance of the respective current paths of the enable signal E and alternate enable signal A.

12. The tristate output device of claim 11 wherein the voltage level shifting means comprises a diode.

13. The tristate output device of claim 10 further comprising diode means coupled in the emitter circuit of the alternate enable transistor element, said diode means selected so that the current path of the alternate enable signal A defined by the alternate enable transistor element, diode means, and active discharge transistor element is substantially the same as the impedance of the current path of the enable signal E defined by the first input transistor element, enable phase splitter transistor element and enable pull-down transistor element.

14. The tristate output device of claim 10 wherein the alternate enable transistor element comprises a second enable input transistor element coupled in emitter follower configuration with the base of the second enable input transistor element tied to the base of the first enable input transistor element of the enable gate, said first and second enable input transistor element bases being operatively coupled to follow the enable gate input signal $\overline{E}$.

15. The tristate output device of claim 10 comprising stabilizing resistor means in the emitter circuit of the alternate enable transistor element.

16. An improved TTL buffer circuit for generating complementary data signals, said buffer circuit having an input and an output, pull-up and pull-down transistor elements operatively coupled to provide high and low voltage level output data signals $\overline{D}$ at the output, phase splitter transistor element operatively coupled to control the states of the pull-up and pull-down transistor elements, and an input transistor element operatively coupled for applying an input data signal D to the base of the phase splitter transistor element, the improvement comprising:

complementary data signal transistor element (Q70) operatively coupled in emitter follower configuration in the buffer circuit (80) with the base of the complementary data signal transistor element (Q70) coupled to follow the input data signal D and provide through the emitter circuit (70) of the complementary data signal transistor element (Q70) a complementary output data signal D in phase with the input data signal D and complementary to the output data signal $\overline{D}$ at the output of the TTL buffer circuit (80).

17. The TTL buffer circuit of claim 16 wherein the base of the complementary data signal transistor element (Q70) is tied to the base of the phase splitter transistor element (Q31), and further comprising a voltage level shifting output element (Q71) coupled in the emitter circuit of the complementary data signal transistor, said voltage level shifting output element selected to equalize substantially the impedance of the current paths of the output data signals $\overline{D}$ and the complementary output data signals D.

18. The TTL buffer circuit of claim 16 wherein the base of the complementary data signal transistor element (Q70) is tied to the base of the phase splitter transistor element (Q31) and further comprising a complementary output transistor (Q71) coupled in the emitter circuit of the complementary data signal transistor element and a complementary buffer circuit (90) coupled to the collector (71) of the complementary output transistor (Q71) for delivering a complementary output data signal D in phase with the input data signal D and complementary to the output data signal $\overline{D}$.

19. An improved TTL circuit for generating complementary data signals comprising:
   an inverting TTL buffer circuit (80) having an input for receiving input data signals D and an output for delivering inverted output data signals $\overline{D}$;
   complementary data signal transistor element (Q70) operatively coupled in emitter follower configuration in the inverting TTL buffer circuit (80) for following the input data signals D and providing through the emitter circuit of the complementary data signal transistor element (Q70) complementary output data signals D;
   and a double inverting TTL buffer circuit (90) operatively coupled to the emitter circuit of the complementary data signal transistor element for providing complementary output data signals D in phase with the input data signals D and complementary to the inverted output data signals $\overline{D}$.

20. The TTL circuit of claim 19 wherein the double inverting TTL buffer circuit (90) comprises a complementary buffer input transistor (Q71) having the base of the complementary buffer input transistor operatively coupled in the emitter circuit (70) of the complementary data signal transistor element (Q70) and a phase splitter transistor element having the base of the phase splitter transistor element coupled to the collector (71) of the complementary buffer input transistor (Q71).

21. The TTL circuit of claim 20 comprising limiting resistor means coupled in the emitter circuit of the complementary data signal transistor element.

* * * * *